United States Patent [19]
Jeong et al.

[11] Patent Number: 5,504,027
[45] Date of Patent: Apr. 2, 1996

[54] METHOD FOR FABRICATING SEMICONDUCTOR MEMORY DEVICES

[75] Inventors: Jae S. Jeong, Seoul; Min H. Park, Chungcheongbuk, both of Rep. of Korea

[73] Assignee: LG Semicon Co., Ltd., Seoul, Rep. of Korea

[21] Appl. No.: 421,998

[22] Filed: Apr. 14, 1995

Related U.S. Application Data

[62] Division of Ser. No. 121,759, Sep. 14, 1993, Pat. No. 5,442,584.

[51] Int. Cl.⁶ ............................................. H01L 21/8242
[52] U.S. Cl. ........................... 437/52; 437/60; 437/919
[58] Field of Search ................................ 437/47, 48, 52, 437/60, 203, 919; 257/301, 302, 303

[56] References Cited

U.S. PATENT DOCUMENTS

| | | | |
|---|---|---|---|
| 4,824,793 | 4/1989 | Richardson | 437/47 |
| 5,017,504 | 5/1991 | Nishimura et al. | 437/203 |
| 5,027,172 | 6/1991 | Jeon . | |
| 5,043,778 | 8/1991 | Teng et al. . | |
| 5,079,605 | 1/1992 | Blake . | |
| 5,096,845 | 3/1992 | Inoue | 437/52 |
| 5,102,817 | 4/1992 | Chatterjee et al. . | |
| 5,144,390 | 9/1992 | Matloubian . | |
| 5,162,250 | 11/1992 | Clark | 437/60 |
| 5,187,566 | 2/1993 | Yoshikawa et al. . | |
| 5,286,663 | 2/1994 | Manning . | |

*Primary Examiner*—Tom Thomas
*Attorney, Agent, or Firm*—Morgan, Lewis and Bockius

[57] ABSTRACT

A method for fabricating a semiconductor memory device including a matrix of memory cells each constituted by one transistor and one capacitor and capable of obtaining a large capacitance for achieving a high integration and yet maintaining superior characteristics of its elements. The method includes the steps of: (a) forming a transistor gate electrode in a portion of an insulating layer formed over a semiconductor substrate, in a buried manner; (b) forming a trench in the semiconductor substrate through a portion of the insulating layer; and (c) forming a transistor channel region, a source, a drain and a capacitor storage node, as a single layer, over a region defined over a transistor gate electrode-buried portion of the insulating layer and a region defined in the trench. Thereby a source, a drain and a gate channel of each transistor and a capacitor storage node are formed by a single layer. With this structure, a minimum information transmitting path is obtained, thereby enabling the overall structure and the fabrication therefor to be simplified. Furthermore, this method makes it easy to form an active region where elements are formed, without using an element isolation process, and thus overall fabrication becomes simplified.

20 Claims, 4 Drawing Sheets

METHOD FOR FABRICATING SEMICONDUCTOR MEMORY DEVICES

CROSS-REFERENCE TO RELATED APPLICATION

This is a divisional of application Ser. No. 08/121,759, filed Sep. 14, 1993, now U.S. Pat. No. 5,442,584.

BACKGROUND OF THE INVENTION

1. Field of the Invention

The present invention relates to a semiconductor memory device and a method for fabricating the same, and more particularly to a dynamic random access memory (DRAM) device and a method for fabricating the same.

2. Description of the Prior Art

As semiconductor devices have a more improved integration degree, the fabrication thereof should satisfy more various requirements. Particularly, in DRAMs, the requirements for the high integration degree include an isolation between neighboring elements and an increase in capacitance.

Silicon-on-insulator (SOI) technique is one of the techniques capable of easily providing an isolation between neighboring elements while improving characteristics of elements.

In accordance with the SOI technique, a transistor is formed on a semiconductor layer disposed over an insulating layer. In the most general SOI structure, a silicon single crystalline layer is formed over a silicon oxide film.

FIG. 1 illustrates a conventional SOI transistor structure.

The SOI technique makes it possible to realize highly dense integrated circuits exhibiting high performance, because it reduces parasitic elements present in integrated circuits formed on bulk semiconductors.

In a MOS transistor formed on a bulk silicon substrate, a parasitic capacity is present between the substrate and source/drain regions. Also, there is a possibility that a breakdown phenomenon occurs at the source/drain regions and the substrate region.

Where a CMOS transistor is formed on a bulk silicon substrate, a latch-up phenomenon may occur at a parasitic bipolar transistor formed due to n-channel and p-channel transistors in neighboring wells.

On the other hand, the SOI structure can reduce considerably parasitic elements and increase a resistance force caused by a junction breakdown. In this regard, the SOI technique has been known as being suitable for fabrication of highly integrated devices with a high performance.

However, such a SOI structure has several problems caused by its lower insulating layer which is denoted by reference numeral 4 in FIG. 1.:

In a bulk transistor which is denoted by reference numeral 1 in FIG. 1., an electrical connection is easily obtained by a body node 12 via a substrate 2.

The body node 12 is maintained at an electrically floated state, because it is insulated from the substrate 2 by the lower insulating layer 4.

Under a sufficient bias between a source 6 and a drain 8, majority carriers move to the body node 12, while minority carriers move to the drain 8. The movement of carriers causes an ion impact by which electron-hole pairs are generated at a region near the drain 8. As a result, a voltage difference occurs between the body node 12 and the source 6 of the transistor.

Such a voltage difference results in a decrease in effective threshold voltage and an increase in drain current. Consequently, a "kink" phenomenon occurs in the drain current-voltage characteristic.

In the SOI structure, there is also a problem that a parasitic "back channel" transistor is formed, which uses the substrate 2 as its gate and the lower insulating layer 4 as its gate insulating layer.

The parasitic "back channel" transistor causes the operation characteristic of transistor to be unstable.

In FIG. 1, the reference numeral 10 is a gate, 16 a gate side wall, and 18 a LDD junction region.

For achieving an high integration of DRAMs, the cell size of DRAMs must be reduced. Such a reduction in DRAM cell size results in a decrease in capacitor area.

However, the capacitor should have a capacitance large enough to generate a signal. Naturally, this requires a sufficiently increased capacitor area.

In this regard, there have been proposed various methods capable of obtaining a large capacitance even at a small capacitor area. One example is disclosed in U.S. Pat. No. 5,102,817. Now, a vertical DRAM cell structure disclosed in U.S. Pat. No. 5,102,817 will be described.

FIG. 2 is a sectional view of the vertical DRAM cell structure.

As shown in FIG.. 2, the DRAM cell is formed on a p type silicon substrate 32 over which an well 34 is formed. The DRAM cell includes a field oxide film 36, an oxide film 38, a nitride film 40, a word line 14, a bit line 20, a bit line strap 24, a $n^+$ capacitor plate region 44, a capacitor insulating oxide film 46, a capacitor plate 48, a transistor channel 58, a gate oxide film 56, and a buried isolation oxide film 52.

In this structure, a cell capacitor is constituted by the capacitor plate 48 and the $n^+$ capacitor plate region 44. The oxide film 46 serves as a capacitor insulating film. Charges are stored in the capacitor plate 48.

A cell transistor is constituted by a source provided by the capacitor plate 48, a drain provided by the bit line 20, a channel provided by the polysilicon channel 58, a gate provided by the word line 14, and the gate oxide film 56.

The DRAM cell with the above-mentioned vertical structure has an advantage of a small occupied area per cell.

However, the structure has at each trench side wall a single conductive layer which has a uniform concentration throughout its length. The conductive layer has a lower portion constituting the capacitor plate 48 and an upper portion constituting the transistor channel 58. Since the single layer with the uniform concentration serves to achieve two functions, operation may become unstable.

SUMMARY OF THE INVENTION

Therefore, an object of the invention is to provide a DRAM cell and a method for fabricating the same capable of obtaining a large capacitance for achieving a high integration and yet maintaining superior characteristics of elements, by taking only the advantages the above-mentioned SOI structure and the above-mentioned DRAM cell structure.

In accordance with one aspect, the present invention provides a semiconductor memory device including a matrix of memory cells each constituted by one transistor and one capacitor, comprising: a gate electrode provided at said transistor of each of said memory cells, said gate electrode being formed in a predetermined portion of an insulating layer disposed over a semiconductor substrate, in a buried manner; a trench formed in said semiconductor substrate through a predetermined portion of said insulating layer; and a semiconductor layer having impurity-doped regions formed in a region defined over a transistor gate electrode-buried portion of the insulating layer and a predetermined region defined in said trench.

In accordance with another aspect, the present invention provides a method for fabricating a semiconductor memory device including a matrix of memory cells each constituted by one transistor and one capacitor, comprising the steps of: (a) forming a transistor gate electrode in a predetermined portion of an insulating layer formed over a semiconductor substrate, in a buried manner; (b) forming a trench in said semiconductor substrate through a predetermined portion of said insulating layer; and (c) forming a transistor channel region, a source, a drain and a capacitor storage node, in the form of a single layer, over a region defined over a transistor gate electrode-buried portion of the insulating layer and a predetermined region defined in said trench.

The present invention improves transistor characteristics, because the transistor gate is formed in a buried manner in the insulating layer formed over the semiconductor substrate.

The DRAM cell structure of the present invention has an improved capacitance, by virtue of its capacitor structure including two capacitors connected to each other in parallel.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
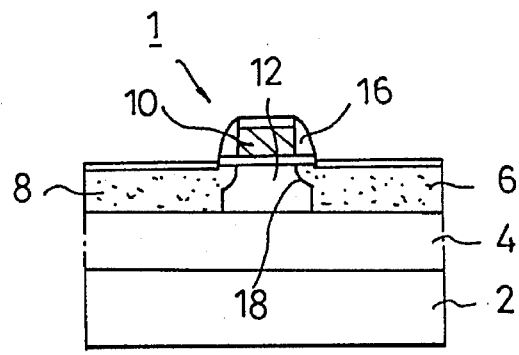
FIG. 1 is a sectional view of a conventional SOI transistor structure.
Figure 2:
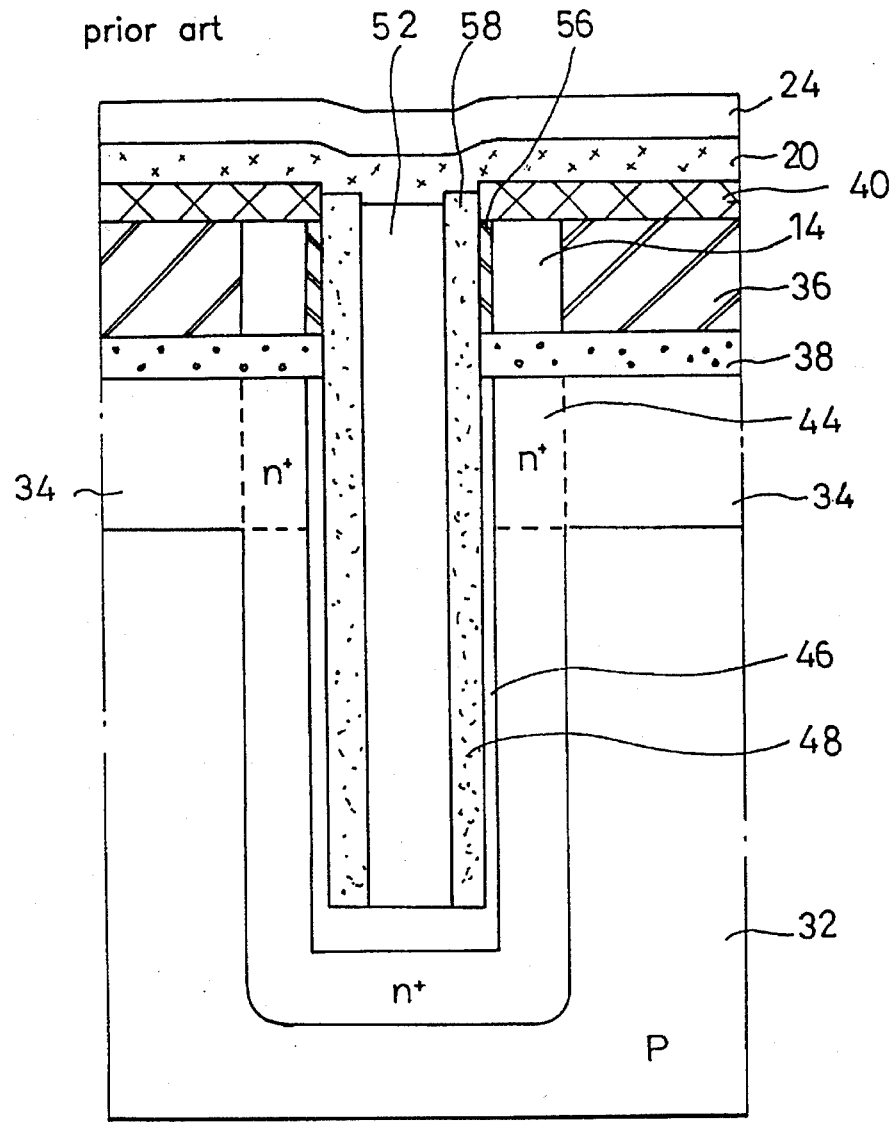
FIG. 2 is a sectional view of a conventional vertical DRAM cell structure.
Figure 3:
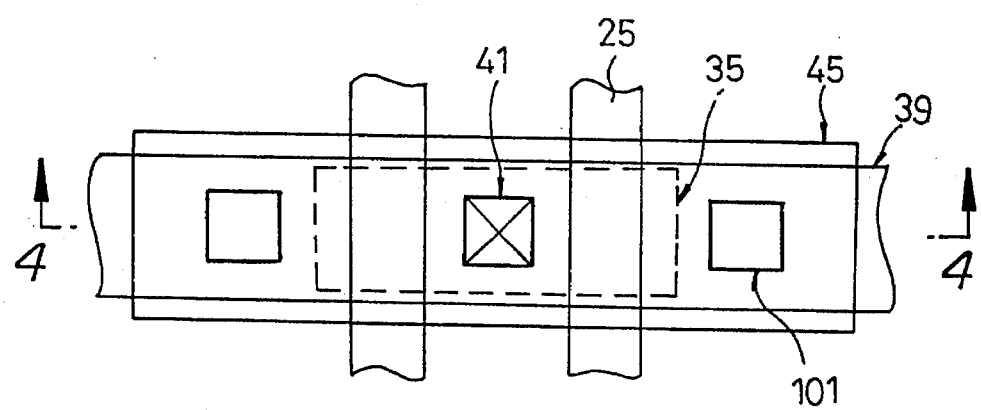
FIG. 3 is a plan view of a DRAM cell structure in accordance with the present invention.

FIG. 3 is a plan view of a DRAM cell according to an embodiment of the present invention. In FIG. 3, there is shown a structure wherein two unit memory cells each constituted by one transistor and one capacitor are arranged to face each other such that their transistors have a common drain at a region disposed beneath a bit line contact which is denoted by the reference numeral 41.

Figure 4:
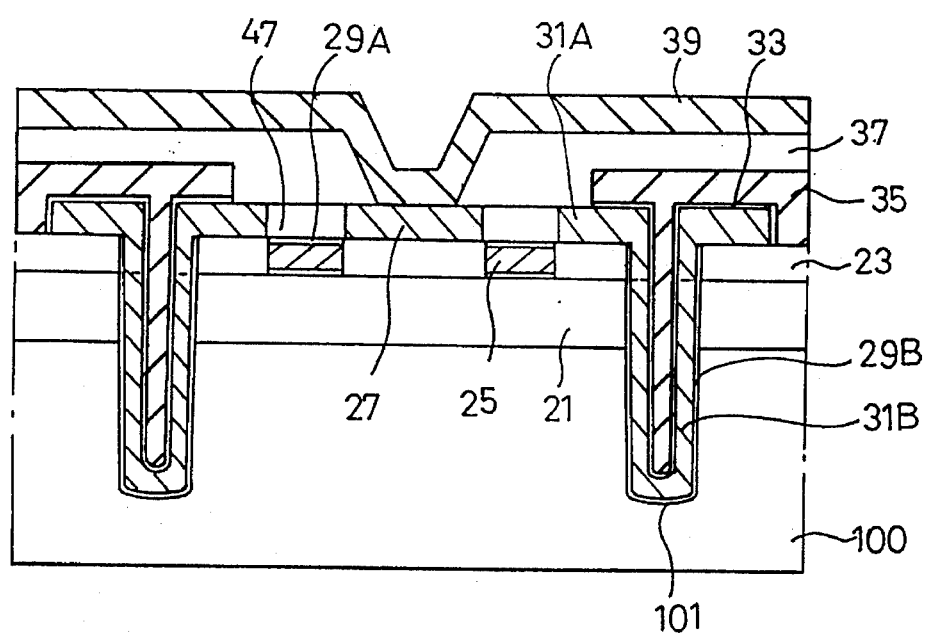
FIG. 4 is a sectional view-of the DRAM cell structure shown in FIG. 3.

FIG. 4 shows a sectional structure taken along the line A—A' of FIG. 3.

As shown in FIG. 4, the DRAM cell of the present invention is formed on a semiconductor substrate which includes a highly doped region, for example, a p+ type substrate region 100 constituting an upper portion of the substrate, a p− epitaxial silicon layer 21 formed over the p+ type substrate region 100, and trenches 101 formed at predetermined portions of the p− epitaxial silicon layer and the p+ type substrate region 100.

Each cell transistor is constituted by a gate (word line) 25 formed in a buried mannerat a predetermined portion of an insulating layer 23 formed over the p− epitaxial silicon layer 21, a gate insulating film 29A formed over the gate 25, a channel region 47 formed on the, gate insulating film 29A, and a drain 27 and a source 31A both formed by doping an impurity in predetermined portions of an n-type silicon layer formed on the insulating layer 23.

Each cell capacitor comprises a first capacitor and a second capacitor connected to the first capacitor in parallel. The first capacitor is constituted by the portion of substrate region 100 disposed around each corresponding trench 101, a first dielectric film 29B formed at the inner wall of the trench 101, and a capacitor storage node 31B formed at the layer where the drain 27 and the source 31A of each corresponding cell transistor are formed. The second capacitor is constituted by the capacitor storage node 31B, a second dielectric film 33 formed over the capacitor storage node 31B, and a capacitor plate electrode 35 formed over the second dielectric film 33.

The source 31A of each cell transistor and the storage node 31B of each corresponding cell capacitor are provided by a single layer, as shown in FIG. 4. The source 31A is provided by the layer region extending from one side portion of the gate 25 to the upper portion of the trench 101 over the gate 25, whereas the storage node. 31B is provided by the layer region extending from the insulating layer 23 to the lower portion of the trench 101 beneath the insulating layer 23.

On the drain 27 of the transistors, a bit line 39 is formed which is connected to the drain 27 through a contact hole formed at an insulating layer 37.

Figure 5:
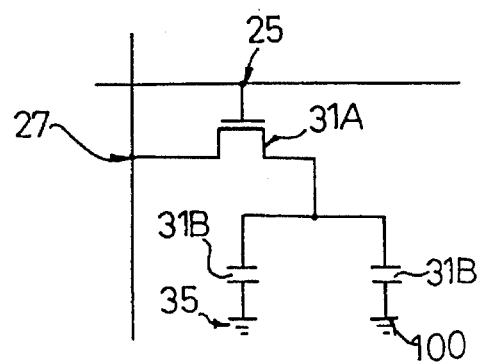
FIG. 5 is a schematic circuit diagram of an equivalent circuit of the DRAM cell structure of FIG. 4.

FIG. 5 is a circuit diagram of an equivalent circuit of the DRAM cell according to the present invention. FIG. 5 shows the first and second capacitors connected to each other in parallel. As mentioned above, the first and second capacitors include the capacitor storage node 31B formed by the layer where the source 31A is formed, in common. As shown in FIG. 5, the first capacitor is constituted by the substrate region 100 and the capacitor storage node 31B, whereas the second capacitor is constituted by the plate electrode 35 and the capacitor storage node 31B.

Referring to FIGS. 6a to 6f, there is illustrated a method for fabricating the DRAM cell according to the present invention.

Figure 6A:
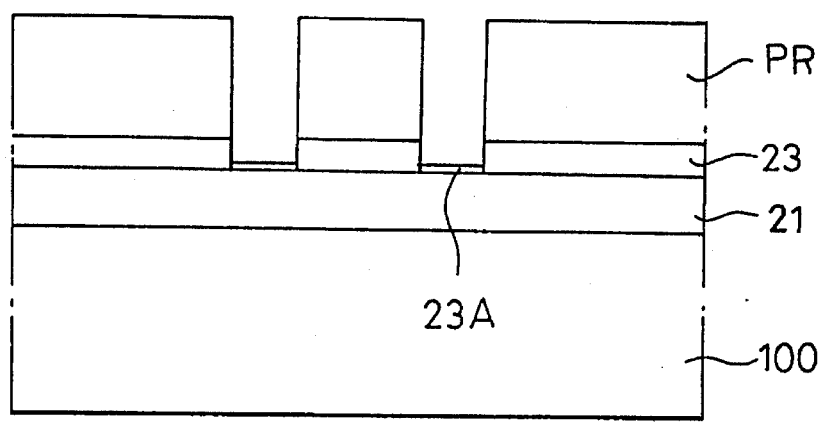
FIGS. 6a to 6f are sectional views illustrating a method for fabricating the DRAM cell structure of FIG. 4 in accordance with the present invention.

In accordance with the illustrated method, first, an impurity-doped region of a high concentration, for example, the p+ type semiconductor region 100 is formed over the semiconductor substrate, to a thickness of at least 1 μm, as shown in FIG. 6a. Over the p+ type semiconductor region 100, the p− spitaxial silicon layer 21 is grown. Thereafter, the insulating layer 23 is formed over the p− epitaxial silicon layer 21.

As the insulating layer 23, a single oxide film may be used. Otherwise, the insulating layer 23 may be comprised of a multilayered film including an oxide film and an impurity-doped oxide film formed over the oxide film. The impurity-doped oxide film may be formed by depositing phosphorous silicate glass (PSG) over the oxide film or depositing doped polysilicon over the oxide film.

A photoresist PR is then coated over the insulating layer 23. The photoresist PR is subjected to a patterning, using a photolithography process, to form a pattern for the word line. Using the photoresist pattern as a mask, the insulating layer 23 is subjected to anisotropic etching at its predetermined portions, to form the word line. Upon the anisotropic etching, the predetermined portions of insulating layer 23 may be completely removed to expose the surface of p⁻ epitaxial silicon layer 21 or partially removed to remain with a predetermined thickness.

In the case where the etching is carried out to expose the surface of p⁻ epitaxial silicon layer 21, an additional oxidation process is used for forming a thin oxide film 23A on the exposed surface of p⁻ epitaxial silicon layer 21.

Figure 6B:
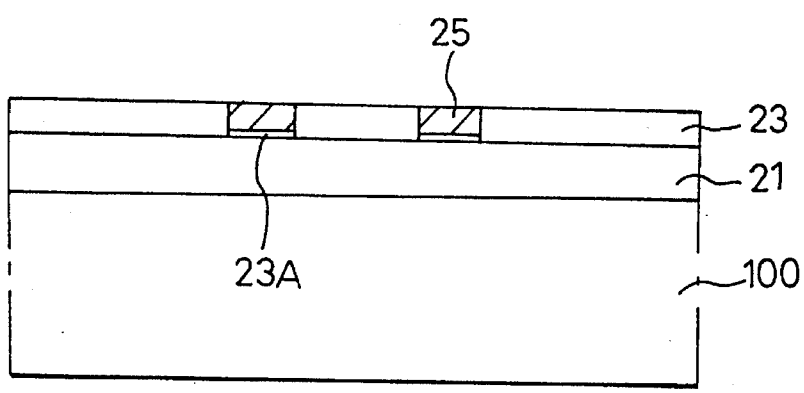

Over the insulating layer 23, a doped polysilicon layer is deposited, which is, in turn, etched back so that it is removed except for its portions buried in the word line (gate) region, as shown in FIG. 6b. Each buried portion of the doped polysilicon layer provides the word line (gate) 25.

Figure 6C:
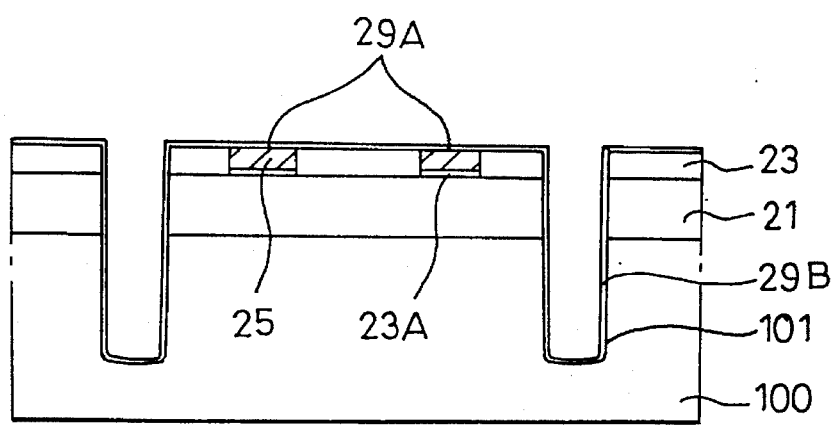

As shown in FIG. 6c, predetermined portions of the insulating layer 23, the p⁻ epitaxial silicon layer 21 and the p⁺ type semiconductor region 100 are etched, to form trenches 101, each disposed laterally near each word line 25 and spaced from the word line 25.

The trenches 101 have a depth adjusted to provide a desired capacitance. They should be deep enough to come into contact with the p⁺ type semiconductor region 100.

Over the entire exposed surface of the resulting structure after the formation of trenches 101, a first dielectric film 29 with a very small thickness is formed. The first dielectric film 29 is used as the gate insulating film 29A on each gate (word line) 25 and as the first capacitor dielectric film 29B on each trench region.

Figure 6D:
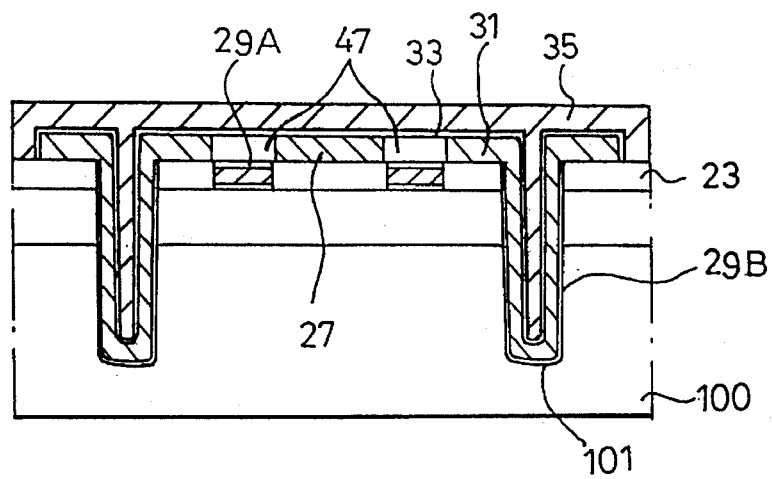

Thereafter, n⁻ polysilicon is deposited over the first dielectric film 29, to form a n⁻ silicon layer 31, as shown in FIG. 6d. The n⁻ silicon layer 31 is then doped with an impurity at regions except for the regions where gate channels are to be formed over the gates (word lines), so that the common drain 27 of transistors and the conductive layer 31 including the source of each transistor and the storage node of each capacitor are formed.

The doping of impurity may be carried out by use of a method of implanting impurity ions in the n⁻ silicon layer 31 after masking n⁻ silicon layer portions disposed over the word lines 25 (gates) by use of a photoresist. Where the trenches have a large depth, the ion implantation is carried out, using a well-known vertical ion implantation for the surface region of the insulating layer 23 and a slant ion implantation for the trench regions.

Where the insulating layer 23 disposed beneath the n⁻ silicon layer 31 contains the PSG or the doped polysilicon, the impurity ions in the PSG and the doped polysilicon are diffused into the n⁻ silicon layer 31 by use of a diffusion process, to dope the layer 31 with the impurity. In this case, the impurity doping is achieved in a self-aligned manner for regions except for the gate channel regions, by virtue of the word lines (gates).

Subsequently, the n⁻ silicon layer 31 which has the source and drain of each transistor and the storage node of each capacitor is patterned by use of a photolithography process, to form a predetermined pattern for defining an active region.

In accordance with the present invention, the definition of each active region and the isolation between neighboring active regions are achieved by patterning the silicon layer having the source and drain of each transistor and the storage node of each capacitor, without using an additional element isolation process which is required in conventional methods.

Over the entire exposed surface of the resulting structure, the second dielectric film 33 is formed to have a small thickness. Over the second dielectric film 33, a doped polysilicon layer is deposited as a conductive layer to be used as the capacitor plate electrode 35.

Figure 6E:
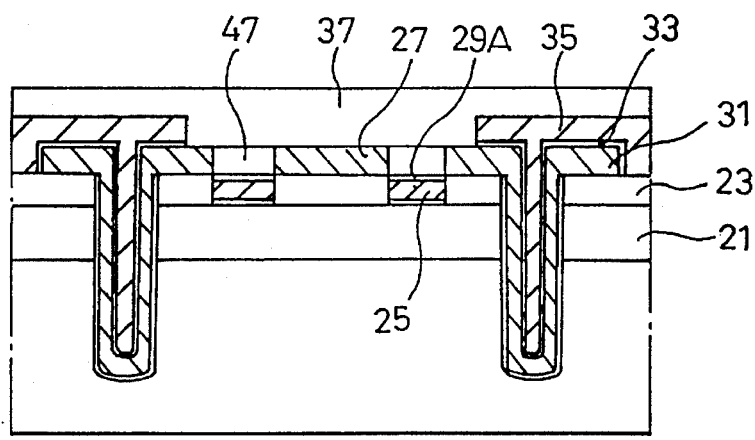

As shown in FIG. 6e, the doped polysilicon layer is patterned to form a predetermined pattern for forming the capacitor plate electrode 35.

Portions of the second dielectric layer 33 exposed upon the patterning for forming the capacitor plate electrode 35 may be etched or left without being etched. In FIG. 6e, the exposed portions of the second dielectric layer 33 are shown as having been etched.

Thereafter, the insulating layer 37 is formed over the entire exposed surface of the resulting structure.

Figure 6F:
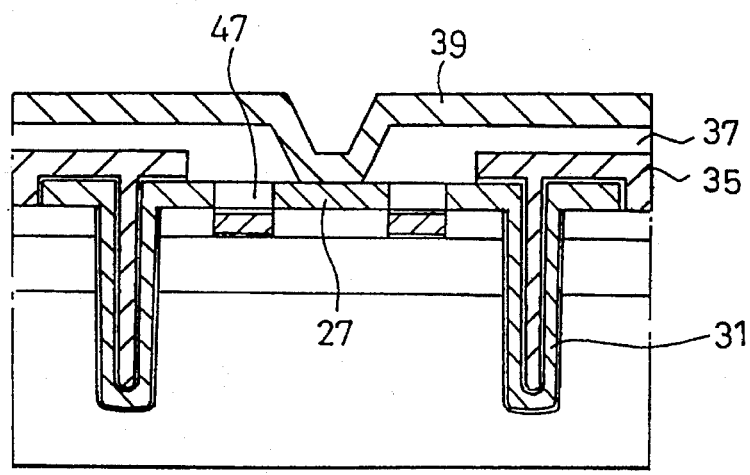

As shown in FIG. 6f, the insulating layer 37 is selectively etched at its predetermined portion, so as to form a bit line contact hole through which the common drain 27 of transistors is exposed. Over the entire exposed surface of the resulting structure, one of doped polysilicon, doped polycide (doped polysilicon+silicide), or doped aluminum is then deposited to form a conductive material layer. The conductive material layer is patterned to form a predetermined pattern for forming the bit line 39. Thus, the DRAM cell with the above-mentioned structure according to the present invention is obtained.

As apparent from the above description, the present invention can provide a transistor free of the "kink" phenomenon and the "back channel transistor" phenomenon, even though the transistor is formed on an insulating layer, as in the conventional SOI transistor structure. Accordingly, it is possible to improve characteristics of elements.

In accordance with the present invention, a capacitor structure is provided, which includes a common storage node formed at the inner wall of a trench, and two plate electrodes connected to each other in parallel, that is, a substrate and a polysilicon layer formed over the storage node via a second dielectric film and connected to the substrate in parallel. With such a capacitor structure, the capacitance per unit capacitor area can be maximized.

In accordance with the present invention, the source and drain and the gate channel of each transistor and the capacitor storage node are formed by a single layer. With this structure, a minimum information transmitting path is obtained, thereby enabling the overall structure and the fabrication therefor to be simplified.

Furthermore, the present invention makes it easy to form an active region where elements are formed, without using an element isolation process. Accordingly, overall fabrication becomes simplified. Also, the present invention can be applied to a small feature size.

Consequently, the present invention makes it possible to improve the characteristics of elements, simplify overall fabrication, and reduce the number of masks used, so that the fabrication cost can be reduced.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A method for fabricating a semiconductor memory device including a matrix of memory cells each constituted by one transistor and one capacitor, comprising the steps of:

(a) forming a transistor gate electrode in a portion of an insulating layer formed over a semiconductor substrate, in a buried manner;

(b) forming a trench in said semiconductor substrate through a portion of said insulating layer; and (c) forming a transistor channel region, a source, a drain and a capacitor storage node, in the form of a single layer, over a region defined over a transistor gate electrode-buried portion of the insulating layer and a region defined in said trench.

2. A method in accordance with claim 1, wherein said semiconductor substrate includes a high concentration substrate region and an epitaxial layer formed over said high concentration substrate region.

3. A method in accordance with claim 1, wherein said step (c) comprises the steps of:

forming a dielectric film over said region defined over said transistor gate electrode-buried portion of the insulating layer and said region defined in said trench;

forming a semiconductor layer over said dielectric film; and doping an impurity in said semiconductor layer except for a region of the semiconductor layer disposed over said transistor gate electrode.

4. A method in accordance with claim 3, wherein said semiconductor layer region disposed over said transistor gate electrode is said transistor channel region.

5. A method in accordance with claim 3, wherein impurity-doped regions of said semiconductor layer disposed at both sides of said transistor channel region are said source and said drain of said transistor.

6. A method in accordance with claim 3, wherein said capacitor storage node is formed in an impurity-doped portion of said semiconductor layer formed in said trench.

7. A method in accordance with claim 3, wherein said capacitor storage node and said source are formed in the same impurity-doped portion of said semiconductor layer.

8. A method in accordance with claim 1, further comprising the step of forming a capacitor plate electrode over said capacitor storage node with a dielectric film being interposed therebetween.

9. A method for fabricating a semiconductor memory device, comprising the steps of:

forming an spitaxial layer of a first conductivity type over a high concentration substrate region of the first conductivity type;

forming an insulating layer over said spitaxial layer;

removing a portion of said insulating layer by use of an anisotropic etching process, thereby forming a transistor gate electrode region;

burying a conductive material in said gate electrode region of the insulating layer, thereby forming a transistor gate electrode;

forming a trench in respective portions of the insulating layer, the epitaxial layer and the high concentration substrate region;

forming a first dielectric film over the entire exposed surface of the resulting structure after the formation of said trench;

forming a semiconductor layer of a second conductivity type over said first dielectric film;

doping an impurity in said semiconductor layer except for a region of the semiconductor layer disposed over said transistor gate electrode, thereby forming a transistor source region, a transistor drain region, and a capacitor storage node;

patterning the semiconductor layer, thereby forming a pattern and defining an active region;

forming a second dielectric film over the entire patterned surface of the semiconductor layer; and forming a conductive layer over the entire exposed surface of the resulting structure after the formation of said second dielectric film and patterning said conductive layer, thereby forming a pattern and defining a capacitor plate electrode.

10. A method in accordance with claim 9, wherein at said step of anisotropically etching said portion of the insulating layer to form-said transistor gate electrode region, the insulating layer portion is completely etched so that a surface of said epitaxial layer disposed beneath the insulating layer portion is exposed.

11. A method in accordance with claim 9, wherein at said step of anisotropically etching said portion of the insulatlng layer to form said transistor gate electrode region, the insulating layer portion is etched so that a thickness thereof is left.

12. A method in accordance with claim 10, further comprising the step of forming a thin oxide film over said spitaxial layer surface exposed after the anisotropic etching of said insulating layer.

13. A method in accordance with claim 9, wherein said insulating layer is comprised of a single layered film or a multilayered film.

14. A method in accordance with claim 13, wherein said insulating layer is an oxide film.

15. A method in accordance with claim 9, wherein said insulating layer is formed by depositing an impurity-doped oxide film or a doped polysilicon film over an oxide film.

16. A method in accordance with claim 9, wherein said gate electrode is formed by depositing a doped polysilicon layer over a portion of said insulating layer formed at said gate electrode region and then etching back said doped polysilicon layer.

17. A method in accordance with claim 9, wherein said semiconductor layer of the second conductivity type is made of polysilicon.

18. A method in accordance with claim 9, wherein said step of doping said impurity in said semiconductor layer of the second conductivity type is achieved by use of one of an ion implantation process and a diffusion process.

19. A method in accordance with claim 9, further comprising:

forming an insulating layer over the entire exposed surface of the resulting structure after the formation of said capacitor plate electrode;

selectively etching a portion of said insulating layer, thereby forming a contact hole for exposing said drain region; and depositing a conductive material over the entire surface of the insulating layer and patterning said conductive material, thereby forming a pattern and forming a bit line connected to the drain region through said contact hole.

20. A method in accordance with claim 19, wherein said bit line is made of a material selected from the group consisting of doped polysilicon, polycide, and aluminum.

* * * * *